(12) United States Patent
Saito et al.

(10) Patent No.: US 8,089,067 B2
(45) Date of Patent: Jan. 3, 2012

(54) SEMICONDUCTOR DEVICE

(75) Inventors: Shinichi Saito, Kawasaki (JP); Hiroyuki Uchiyama, Musashimurayama (JP); Toshiyuki Mine, Fussa (JP)

(73) Assignee: Hitachi, Ltd., Tokyo (JP)

( * ) Notice: Subject to any disclaimer, the term of this patent is extended or adjusted under 35 U.S.C. 154(b) by 288 days.

(21) Appl. No.: 12/318,452

(22) Filed: Dec. 30, 2008

(65) Prior Publication Data
US 2009/0179200 A1  Jul. 16, 2009

(30) Foreign Application Priority Data

Jan. 10, 2008  (JP) ................. 2008-003029

(51) Int. Cl.
*H01L 33/00* (2010.01)
(52) U.S. Cl. ....... 257/49; 257/79; 257/94; 257/E33.003; 257/E33.045; 257/E33.046
(58) Field of Classification Search .......... 257/49, 257/79, 94, E33.045, E33.046, E33.003
See application file for complete search history.

(56) References Cited

U.S. PATENT DOCUMENTS

| | | | |
|---|---|---|---|
| 6,849,917 B2* | 2/2005 | Maruyama | 257/448 |
| 2001/0054712 A1* | 12/2001 | Aoki | 257/72 |
| 2002/0167052 A1* | 11/2002 | Chang et al. | 257/355 |
| 2006/0261350 A1* | 11/2006 | Kawazoe et al. | 257/79 |
| 2008/0128713 A1* | 6/2008 | Saito et al. | 257/86 |
| 2008/0213979 A1* | 9/2008 | Kannou | 438/462 |
| 2009/0075410 A1* | 3/2009 | Thomas et al. | 438/22 |
| 2009/0130827 A1* | 5/2009 | Choi et al. | 438/486 |

FOREIGN PATENT DOCUMENTS

JP  2007-294628  4/2006

OTHER PUBLICATIONS

C. W. Tang et al., "Organic Electroluminescent Diodes", Appl. Phys. Lett. vol. 51, No. 12, Sep. 1987, pp. 913-915.
L. T. Canham, "Silicon Quantum Wire Array Fabrication by Electrochemical and Chemical Dissolution of Wafers", Appl. Phys. Lett. Vo. 57, No. 10, Sep. 3, 1990, pp. 1046-1048.
D. J. Lockwood et al., "Quantum Confined Luminescence in Si/SiO$_2$ Superlattices", Physical Review Letters, vol. 76, No. 3, Jan. 15, 1996, pp. 539-541.

* cited by examiner

*Primary Examiner* — Victor A Mandala
(74) *Attorney, Agent, or Firm* — Stites & Harbison PLLC; Juan Carlos A. Marquez, Esq.

(57) ABSTRACT

A self emission silicon emission display is provided at a low price, which contains silicon and oxygen which exist in abundance on the earth as the main component and which can be easily formed by conventional silicon process. A light emission element includes a first electrode for injecting electrons, a second electrode for injecting holes, and a light emission part electrically connected to the first electrode and the second electrode, where the light emission part includes amorphous or polycrystalline silicon consisting of a single layer or plural layers and where the dimension of the silicon in at least one direction is controlled to be several nanometers.

2 Claims, 12 Drawing Sheets

SEMICONDUCTOR DEVICE

CLAIM OF PRIORITY

The present application claims priority from Japanese patent application JP 2008-003029 filed on Jan. 10, 2008, the disclosure of which is hereby incorporated by reference into this application.

CROSS-REFERENCE TO RELATED APPLICATIONS

The present application is related to U.S. application Ser. No. 11/935,904 filed on Nov. 6, 2007 and U.S. application Ser. No. 12/245,077 filed on Oct. 3, 2008, the disclosures of which are hereby incorporated by reference into this application.

FIELD OF THE INVENTION

The present invention relates to a light emission element using silicon and specifically to a light emission element using an ultrathin silicon film.

BACKGROUND OF THE INVENTION

Various light emission elements, such as the incandescent lamp developed by Edison, a fluorescent lamp, an LED (Light Emitting Diode), and an organic EL (electroluminescence), etc. exist in our life. They each have advantages and disadvantages, and they have been used according to a variety of applications including lights, televisions, and displays, etc. Therein, an LED using a compound semiconductor has high quantum efficiency where current is converted into light, so that it is used for a light emission element with high luminance and low power consumption. In these days, since crystal growth techniques of compound semiconductors have been progressing, blue light-emitting diodes which have been thought impossible in the twentieth century have been coming into wide use. For instance, they have been put to practical use such as in traffic lights. Since it has become possible to achieve blue, it has become possible to express three primary colors by using an LED with compound semiconductors. As a result, it has been possible to display white by combining a compound semiconductor and a phosphor material.

Therefore, an LED with a compound semiconductor becomes widespread as a light source for the back-light of a liquid crystal display of a cellular phone. An LED with a compound semiconductor has the advantage of high performance, such as high quantum efficiency and low power consumption, etc. However, since the compound semiconductor substrate is expensive and the manufacturing cost becomes high, in general, it is not suitable for a large surface area. However, an LED with a compound semiconductor can be used for a large display which is seen in public facilities such as train stations and airports. For applications in displays and lights, the LED which has gained attention recently is an organic EL element (or it may be abbreviated as an organic LED and OLED). Research on organic EL elements has explosively progressed since the latter half of the 1980's. C. W. Tang and S. A. VanSlyke, Appl. Phys. Lett. (1987), vol. 51, pp. 913-915 written by C. W. Tang became the seminal work and they successfully obtained high efficiency emission by carrying current in a structure where electrodes are formed on the upper and lower surfaces of an organic thin film. However, the organic EL element had a short lifetime at first, and it was not put to a practical use. Since organic semiconductor materials, element structures, and sealing technologies have been progressing lately, installation in cellular phones has started and application in televisions has finally come to be discussed seriously.

As mentioned above, LED technology keeps progressing day by day, and research and development have been performed to develop an LED with low cost, high efficiency, low power consumption, large surface area, and high reliability. As a luminescent material for an LED, a semiconductor is used, and the material used most as a semiconductor is silicon. The percentage of elements existing in the vicinity of the surface of the Earth is known as a Clarke number; the Clarke number of silicon is 25.8% and it is the second most abundant element on the Earth next to oxygen with 49.5%. As a matter of course, the manufacturing cost is inexpensive and the technology for achieving high purity has been established, so that it is well known that silicon is used for a substrate material supporting electronics such as LSI (Large Scale Integration). Although silicon has various excellent features as a semiconductor material, it is difficult for it to emit with high efficiency which can be said to be the only disadvantage. The reason is that silicon is an indirect transition semiconductor in the bulk state. If silicon can be used as a luminescent material, it becomes possible to manufacture the light emission elements with high reliability inexpensively and on a large scale, so that it is needless to say that the industrial impact is enormous.

Then, a lot of research and development on making silicon an emitter has been carried out. In particular, much research has been carried out for improving the emission efficiency by the quantum confinement effect which has been proposed by L. T. Canham in L. T. Canham, Appl. Phys. Lett. (1990), vol. 57, pp. 1046-1048. The quantum confinement effect is an effect where the electron state changes with a low-dimensional structure such as a porous silicon and a nanocrystalline silicon, and silicon which does not emit in the bulk state becomes an emitter of light according to the quantum confinement effect when it has a low-dimensional nanostructure. Actually, there are many reports in which it emits with high efficiency by photoluminescence. For instance, in D. J. Lockwood, Z. H. Lu, and J. M. Baribeau, Phys. Rev. Lett. (1996), vol. 76, pp. 539-541, highly efficient photoluminescence was observed in a stacked structure of an amorphous silicon and silicon dioxide.

However, there is a problem that hardly any current is carried when it is made into a low-dimensional nanostructure. This is caused by the fact that the surface of silicon is easily oxidized and it becomes silicon dioxide which is an insulation material with a large band gap when it is oxidized. It is necessary to make it a low-dimensional nanostructure when silicon which does not emit in the bulk state is made to emit. The emission efficiency increases as it becomes a lower dimensional fine structure, but since it makes it has been made easy to cover the surrounding of the silicon nanostructure with an insulator film, it becomes difficult to flow a current therein. Since this is an intrinsic problem, it has been thought that it is very difficult to solve this dilemma. Because a conventional device carries the current perpendicular to, for instance, the stacked structure of the ultrathin silicon thin film and the silicon dioxide, carriers could be injected only by tunneling the silicon dioxide which is an insulator film. Forming p-type and n-type electrodes over the upper and the lower surfaces is a common structure of an LED, in which a compound semiconductor and an organic semiconductor are used, and a silicon LED with such a structure has terribly low efficiency.

Our group developed a device structure where this essential dilemma is easily solved when an advanced fine processing technique for silicon is used. It is a horizontal current injection type ultrathin film single crystal silicon light emission element disclosed in JP-A-2007-294628. This element forms a two-dimensional nanostructure by making the single crystalline silicon, which has a (100) face as the surface crystalline structure over an SOI (Silicon-On-Insulator) substrate, partially thin by using an oxidation process. The two-dimensional single crystalline silicon thin film having the quantum confinement effect is connected to a thick silicon electrode which is highly doped not through the silicon dioxide insulator film. Because it is connected directly, it is possible to inject current with high efficiency. As a result, a light emission element with high efficiency using silicon as a luminescent material could be successfully achieved. The silicon element has originally a planar structure and it is suitable for making it into a planer state. Therefore, in an LED, a device structure more suitable for a silicon LED can be designed by taking an idea of making it into a planar structure to which a general vertical structure is rotated by 90 degrees.

SUMMARY OF THE INVENTION

As described above, an ultrathin single crystal silicon light-emitting diode disclosed in JP-A-2007-294628 has the superior characteristics of a silicon light emission element to which current is directly injected. However, since single crystalline silicon is used for a light emission layer, it is necessary to use an expensive SOI substrate as a substrate, thereby, a problem arises that the manufacturing cost becomes high. Moreover, for a large screen display element such as a display, not only the cost becomes high but also an SOI substrate of 300 mm or more is not technically sold commercially, so that there is a problem that it cannot be applied to a large substrate for a large screen display and a television.

Additionally, in order to make the silicon emit visible light, it is necessary to control, at the atomic layer level, the formation of a nanostructure of several nanometers or less. Therefore, there has been a problem that it is difficult to manufacture an active matrix type display uniformly and with high yield, which is a display where many LEDs are integrated. Specifically, the emission wavelength changes when the dimension in the confinement direction of the silicon nanostructure shifts only 0.5 nm, so that there has been a problem that, for instance, the region to display blue shows green. Therefore, there has been a problem that it is necessary to have a robust device design not o create defective goods even when a minute deviation occurs from the design.

Moreover, when an LED is manufactured by using a material other than silicon, for instance, a compound semiconductor, there has been a problem of increasing cost even if it can display white. Therefore, it has been a subject that a low cost white LED, which can substitute a low cost illuminator such as a fluorescent lamp, is realized by using a silicon material.

Moreover, since the ultrathin single crystal silicon light-emitting diode disclosed in JP-A-2007-294628 is a linear light emission element, there has been a problem that, when the pn junction or the pin junction is linear, emission occurs only at the linear junction part of the pixel and the brightness of all aspects of the pixel cannot be made greater. Therefore, it has been a subject to create emitted light in wider regions of the light-emitting diode in order to make all aspects of the pixel brighter.

Moreover, in a self-emission LED which is thought to be a prime candidate of the next generation flat panel display such as an organic EL, there has been a problem that the organic material is breakable when it carries a current and the reliability thereof was low. Therefore, it has been a subject to achieve a light emission LED with high reliability by using silicon with a wealth of achievements in practical use as LSI and TFT (Thin-Film-Transistor). In addition, it has been necessary to use a transparent electrode as an electrode for the part which takes out the light, reflecting that the conventional light emission element such as an organic EL has a vertical structural pn junction. However, indium included in ITO (Indium-Tin-Oxide) which conventionally is used for a transparent electrode is a rare metal and it is not only expensive but also carries the possibility of exhausting natural resources. Additionally, there is a possibility of danger of increasing the environment burden such as to the fear of indium exerting an influence as a health hazard. Therefore, it has been a subject of discussion that there is a desire to develop a light emission element without introducing a transparent electrode such as ITO, without using a rare metal, and using a material having small environmental burden.

The present invention is developed in view of the foregoing conventional problems, and an object thereof is to solve all the aforementioned subjects. That is, it is an object to provide a light emission element and a manufacturing method thereof in which an amorphous or polycrystalline silicon thin film is formed as a light emission layer over a substrate such as silicon and glass by a low cost process which is easily available to form using a conventional silicon process. Moreover, it is another object of the present invention to provide a visible light emission display using silicon as the light emission layer and a manufacturing method thereof. Moreover, it is another object of the present invention to provide a light emission element and a manufacturing method thereof including silicon as a light emission layer for making all aspects of the pixel brighter. Furthermore, it is another object of the present invention to provide a light emission element and a manufacturing method thereof for displaying white or an arbitrary color which can be used in lighting and displays.

Moreover, it is another object of the present invention to provide a robust light emission element and a manufacturing method thereof in which the emission wavelength does not greatly deviate from the design even if design parameter such as the film thickness deviates from the design in the manufacturing process. Moreover, it is another object of the present invention to provide an emission element and a manufacturing method thereof in which a transparent electrode and a rare metal are not used, and in which silicon and oxygen with low environmental impact and present in large quantity in the earth are used as a main component.

An outline of the typical embodiments in the inventions disclosed in the present invention will be disclosed as follows. A light emission element of the present invention includes a first electrode for injecting electrons, a second electrode for injecting holes, and a light emission part electrically connected to the first electrode and the second electrode, in which the light emission part includes an amorphous or polycrystalline silicon consisting of a single layer or plural layers and the dimension of the silicon in at least one direction is controlled to be several nanometers.

Using an amorphous or polycrystalline silicon for the light emission layer gives a longer lifetime until the recombination of the carriers than using single crystal silicon with the surface structure of (100). However, there is no problem for an LED application where an ultra high speed device such as a direct modulated laser, etc. is not manufactured and a display application such as a display is the main target.

Effects obtained by a typical one of the inventions disclosed in the present invention will be briefly described as follows. According to the aspects of the present invention, a self emission silicon light emission display can be provided inexpensively, which can be easily formed using a conventional silicon process over a substrate such as silicon. In particular, since amorphous and polycrystalline silicon are used as the light emission layer, it is not necessary to use an expensive SOI substrate and it is possible to decrease the cost considerably.

DETAILED DESCRIPTION OF THE PROFFERED EMBODIMENTS

Figure 1:
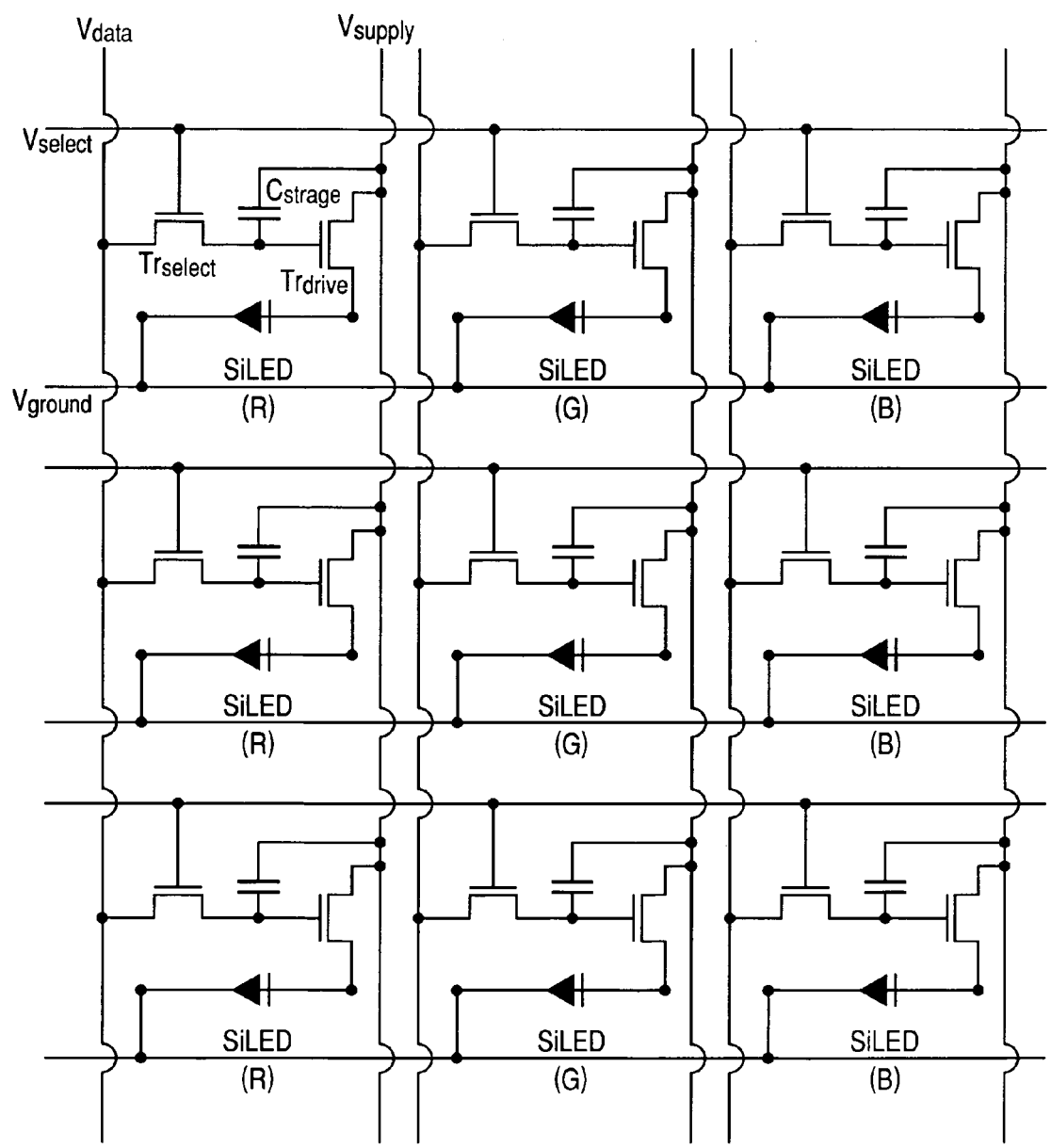
FIG. 1 is a circuit drawing illustrating a display of a silicon light-emitting diode in the first embodiment of the present invention.

Hereinafter, the embodiments of the present invention will be described referring to the drawings. In all the drawing for explaining the embodiments, the same codes are given to the components having the same functions and repeated explanations will be omitted. Moreover, since the drawings are created to facilitate the understanding, the main part is emphasized and it is not necessarily scaled with precision. Moreover, it is needless to say that many changes are possible such as a combination of the materials and the manufacturing process is changed in addition to the method introduced in this embodiment.

First Embodiment

In this embodiment, a silicon light emission display manufactured by a method which can form it easily using a conventional silicon process and a manufacturing method thereof are disclosed. A silicon light emission diode based on the present invention is for brevity sake is SiLED and designated as SiLED.

FIG. 1 is basic circuit drawing illustrating a silicon light emission display according to the present invention. Three kinds of LEDs for displaying the three primary colors of red, green, and blue are used for the SiLED which will be an essential light emission part, and they are described as (R), (G), and (B), respectively. These three sub-pixels are combined to constitute one pixel and many pixels are integrated altogether to compose a display. Of course, when it is not necessary to have a full-color display, any of red, green, and blue or a combination of any of these colors may used for manufacturing a display. Moreover, when only lighting, blinking, and non-lighting is realized such as switches, it is clear that only one SiLED is enough.

The circuit shown in FIG. 1 is an active matrix type and each sub-pixel includes two transistors which are a selecting transistor (Trselect) for selecting the pixel and a driving transistor (Trdrive) for driving the SiLED, and on/off of the gate voltage of the driving transistor (Trdrive) is switched by letting charges to the storage capacitor (Cstrage) in and out at the selecting transistor (Trselect). In the circuit shown in FIG. 1, the data line Vsupply for supplying the power source and the data line Vdata for supplying the brightness data, are wired vertically and the gate line for driving the selecting transistor (Trselect) and the grand line Vground connected to the other end of the SiLED are wired horizontally. The vertical and horizontal arrangements of wiring are not intended to be limited to this. In this embodiment, wiring was arranged to drive 1920×1080 pixels (horizontal×vertical), thereby achieving a full high-definition television display.

First of all, a substrate 1 was prepared and the selecting transistor (Trselect), the driving transistor (Trdrive), and the storage capacitor (Cstrage) were manufactured by well-known manufacturing methods for a transistor. In this embodiment, a high performance transistor was produced in which single crystal silicon was used as channel by using a single crystal silicon substrate as the substrate. However, a TFT where amorphous silicon and polycrystalline silicon are used as channels by using a glass substrate may be used for the selecting transistor and the driving transistor. Moreover, a material such as an oxide semiconductor may be used for the transistor. When an glass substrate is used for a substrate and a transparent oxide semiconductor is used for the transistor, the SiLED which becomes the light emission part can be made thinner so as to be transparent, so that it is possible to make the display almost perfectly transparent.

A transparent display can be expected to be new applications such as a display and window glass mounted on the windshield of an automobile being used for a display, etc. The advantage of using the single crystal silicon and the polycrystalline silicon as a substrate is that a large scale integrated circuit (LSI) such as a driver for driving a display can be manufactured simultaneously with the display panel. In this embodiment, both the selecting transistor (Trselect) and the driving transistor (Trdrive) are made with an n-channel transistor which can operate at high-speed. However, a p-channel transistor may also be used. The channel lengths of the selecting transistor (Trselect) and the driving transistor (Trdrive) used in this embodiment is as small as 0.1 µm and has high performance in this embodiment. However, a transistor with a larger channel length may be used in order to reduce the cost. Actually, in this embodiment, the driver circuits (not shown in the figure) are integrated in the vicinity of the display. When a TFT using amorphous silicon over a glass substrate is used, there is an advantage of reduced cost.

The SiLED and a display using the SiLED of the present invention can achieve an active matrix display with low power consumption by using these well-known transistor technologies. However, if a transistor is not used, a passive matrix display can be achieved by selecting pixels using the array wired vertically and horizontally because the SiLED itself is a diode.

Figure 2:
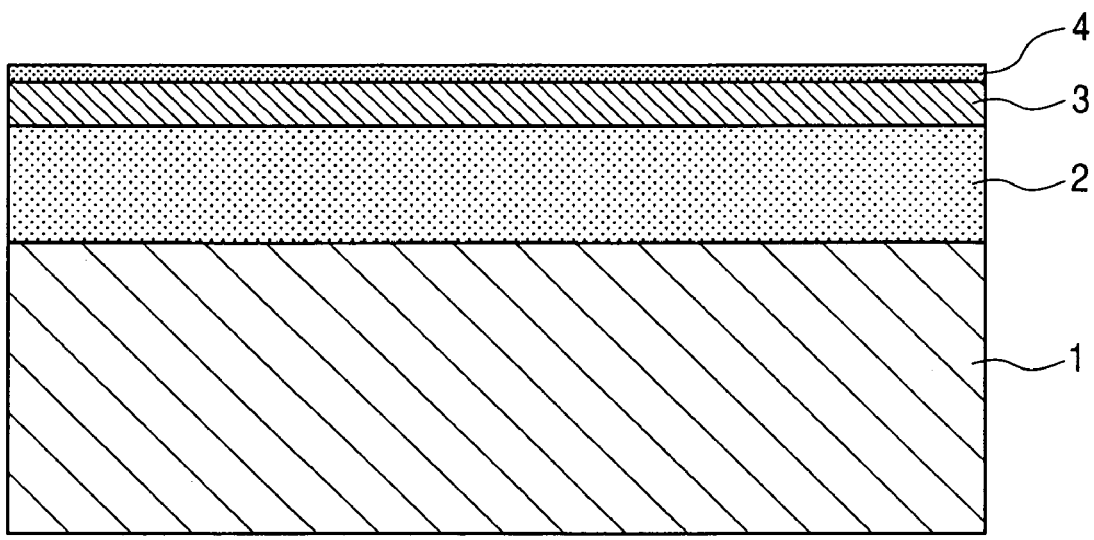
FIG. 2 is a cross-sectional drawing illustrating a manufacturing procedure of a silicon light-emitting diode in the first embodiment of the present invention.

Next, a manufacturing process of the SiLED is disclosed. FIG. 2 to FIG. 9 are cross-sectional schematic drawings illustrating a manufacturing procedure of a SiLED based on this embodiment. As shown in FIG. 2, silicon dioxide 2, polycrystalline silicon 3, and silicon dioxide 4 were deposited over a silicon substrate 1. Herein, although it is not shown in FIG. 2, a selecting transistor (Trselect), a driving transistor (Trdrive), and a storage capacitor (Cstrage) are formed below the polycrystalline silicon 3 over the silicon substrate 1, thereby enabling the surface area of the light emission part in the pixel to be made large. When the selecting transistor and the driving transistor are formed in the same layer as the SiLED such that they are formed of the polycrystalline silicon 3, there is a disadvantage that the area of the light emission part is made smaller, but there is an advantage that the number of manufacturing process steps can be decreased and the manufacturing cost can be reduced. An amorphous silicon may be used instead of the polycrystalline silicon 3. When an amorphous silicon is used, the resistance increase due to the mobility thereof decreases compared with the case of using polycrystalline silicon. However, there is an advantage that the process temperature can be decreased.

Figure 3:
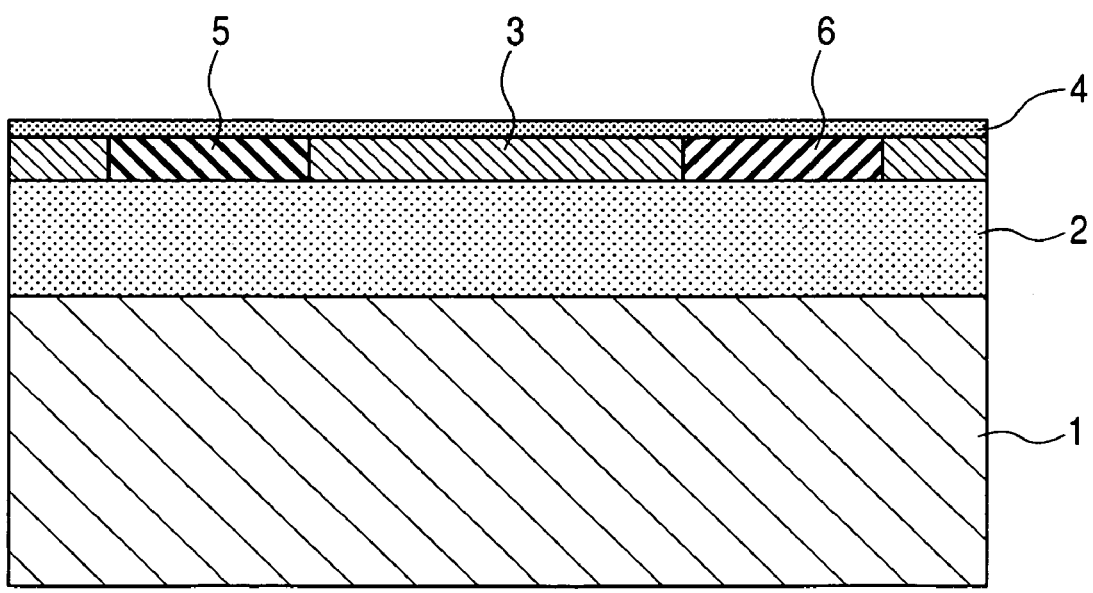
FIG. 3 is a cross-sectional drawing illustrating a manufacturing procedure of a silicon light-emitting diode in the first embodiment of the present invention.

Next, as shown in FIG. 3, ions were injected after the resist-patterning using a conventional photolithography technique; the resist was removed; and active annealing was performed; thereby forming a p-type Si electrode 5 and an n-type Si electrode 6 where impurities were doped only into the desired areas.

Figure 4:
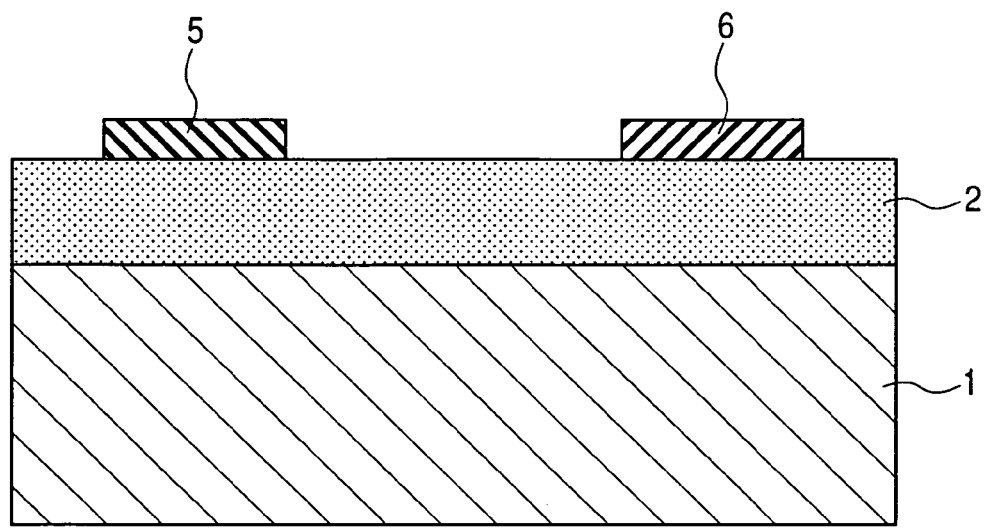
FIG. 4 is a cross-sectional drawing illustrating a manufacturing procedure of a silicon light-emitting diode in the first embodiment of the present invention.

Next, after the silicon dioxide 4 was removed by a cleaning process using HF and resist-patterning performed by using a conventional photolithography technique, the p-type Si electrode 5 and the n-type Si electrode 6 were made into the state shown in FIG. 4 by performing dry-etching on the polycrystalline silicon 3.

Figure 5:
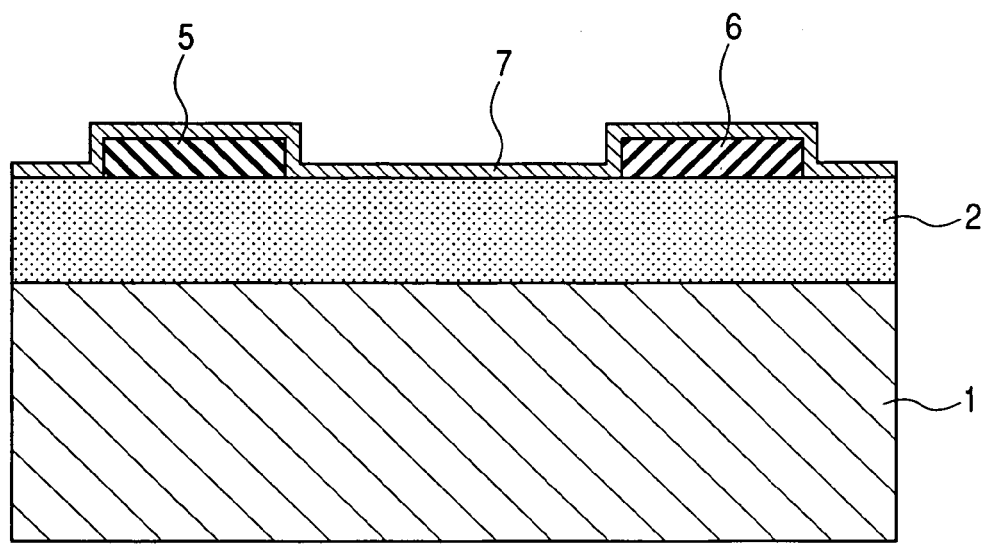
FIG. 5 is a cross-sectional drawing illustrating a manufacturing procedure of a silicon light-emitting diode in the first embodiment of the present invention.

Next, by using a CVD (Chemical Vapor Deposition) technique, the state shown in FIG. 5 was made where an ultrathin amorphous silicon 7 was deposited over the entire surface. Although various techniques except for a CVD technique, such as a sputtering technique, are known as techniques for depositing the ultrathin amorphous silicon, a CVD technique is preferable because the film can be deposited without breaking even if fine roughness exists. A polycrystalline silicon may be used instead of amorphous silicon. It is necessary that the ultrathin amorphous silicon 7 be controlled precisely to determine the emission wavelength of the SiLED. It is desirable that the film thicknesses of the ultrathin amorphous silicon 7 be controlled to be about 2.0±0.5 nm, 1.5±0.5 nm, and 1.0±0.5 nm for displaying red, green, and blue as the emission wavelengths, respectively. The emission wavelength slightly depends on the fine crystal structure, atomic composition such as hydrogen concentration, and the roughness of the film, etc. in addition to the film thickness, so that the film thickness for obtaining the desired wavelength depends on it and deviates by about several nanometers. Moreover, the ultrathin amorphous silicon 7 may be a one-dimensional nano-wire instead of making it into a two-dimensional thin film. In this embodiment, first, a 2.0 nm thick ultrathin amorphous silicon 7 is deposited for manufacturing the SiLED which emits red.

Figure 6:
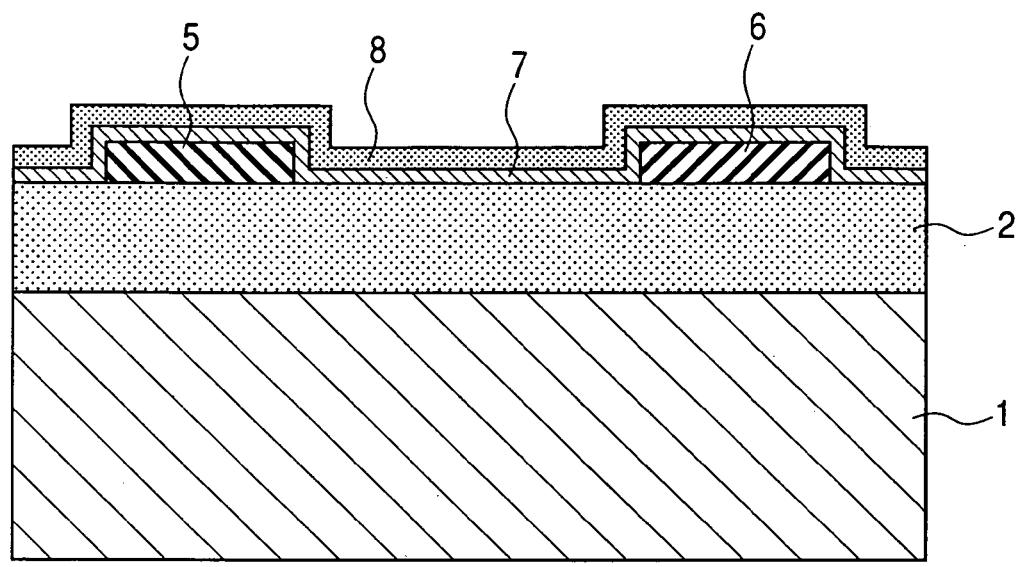
FIG. 6 is a cross-sectional drawing illustrating a manufacturing procedure of a silicon light-emitting diode in the first embodiment of the present invention.

In order to protect the surface, the state of FIG. 6 was made by forming a 10 nm thick silicon dioxide 2 using a CVD technique. Instead of using the CVD technique as shown in this embodiment, formation of the silicon dioxide 8 may be carried out by depositing the ultrathin amorphous silicon 7 thicker than 2.0 nm while making the state from FIG. 4 to FIG. 5, and oxidizing the ultrathin amorphous silicon 7 to be 2.0 nm in thickness by a thermal oxidation process. Moreover, silicon nitride may be used instead of forming silicon dioxide 8. When silicon nitride is used, an effect of improving the long-term reliability could be obtained because of the large amount of hydrogen included in silicon nitride.

Next, the SiLED emitting red is protected by a resist-patterning using a conventional photolithography technique and, by performing a cleaning treatment using a wet etching technique, the ultrathin amorphous silicon formed on the pixel part for emitting green and blue is removed (not shown in the figure). In this state, the configuration of the pixel part for emitting green and blue becomes the same state as shown in FIG. 4. Next, in order to form the SiLED for emitting green, a 1.5 nm thick ultrathin amorphous silicon 7 is formed by a CVD technique and made the pixel part for emitting green as shown by the state in FIG. 5. Next, in order to protect the surface of the pixel part for emitting green, the state shown in FIG. 6 is created where a 10 nm thick silicon dioxide 8 is formed by using a CVD technique.

Herein, a 1.5 nm thick ultrathin amorphous silicon for emitting green is also deposited over the pixel part for emitting red (not shown in the figure). Since the 1.5 nm thick ultrathin amorphous silicon for emitting green is not connected to the electrode of the pixel part for emitting red, it does not contribute to the current injection emission. However, it is preferably removed in order to increase the color purity of the light. Then, the SiLED for emitting green is protected by a resist-patterning using a conventional photolithography technique and by performing cleaning treatment using a wet etching technique, the 1.5 nm thick ultrathin amorphous silicon for emitting green formed on the pixel part for emitting red and blue is removed (not shown in the figure).

Figure 10:
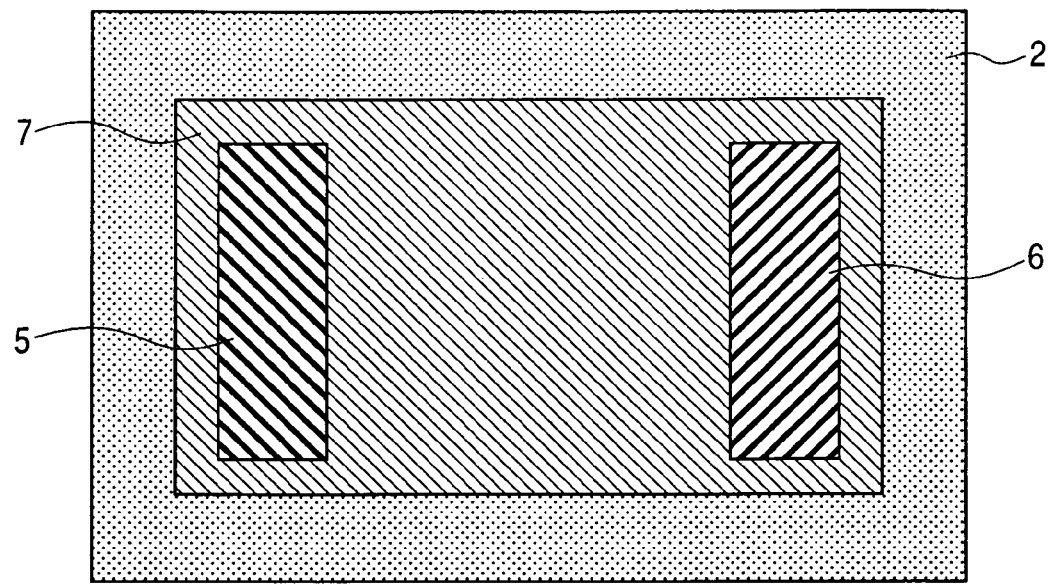
FIG. 10 is a drawing seen from the upper part illustrating a manufacturing procedure of a silicon laser in the first embodiment of the present invention.
Figure 11:
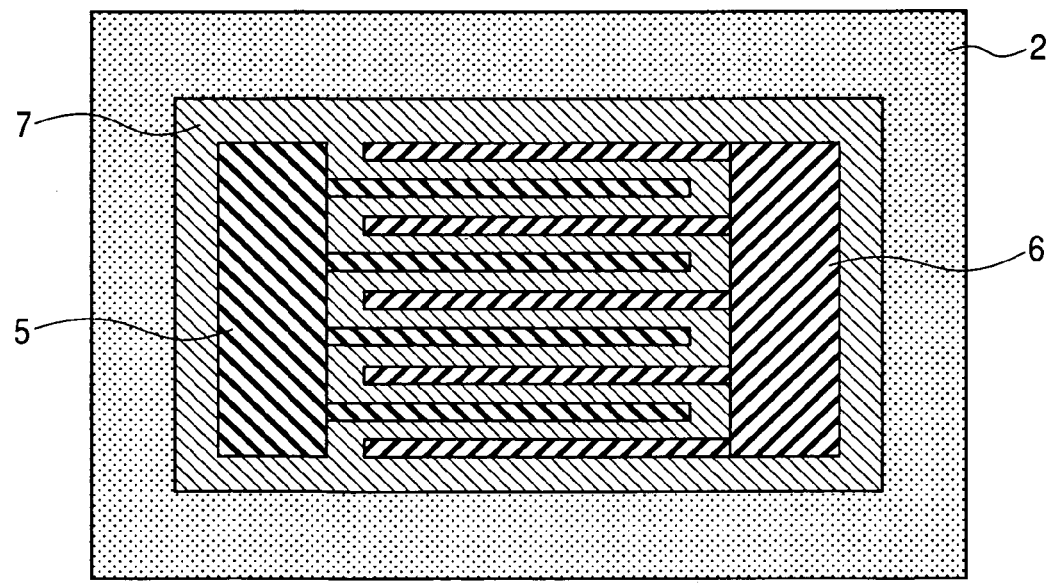
FIG. 11 is a drawing seen from the upper part illustrating a manufacturing procedure of a silicon laser in the first embodiment of the present invention.

By performing the same process on the pixel part for blue, a 1.0 nm thick ultrathin amorphous silicon and silicon dioxide for protecting the surface thereof are formed over the pixel part for emitting blue, and the 1.0 nm ultrathin amorphous silicon deposited over the pixel part for emitting red and green is removed (not shown in the figure). The appearance of the SiLED shown from the upper part is shown in FIG. 10 and FIG. 11. Herein, in order to make it easy understand, the silicon dioxide 8 was not shown in the figure. The general layout has the pixel structure as shown in FIG. 10. However, in this case, light emission occurs only at the center and linearly, so that it is not enough to make all the pixels brighter. Therefore, in this embodiment, as shown in FIG. 11, the p-type Si electrode and the n-type Si electrode 6 were processed in a skewer shape, respectively. The width can be made wider practically by doing it like this and there was success in making all the pixels brighter when emitting light.

Figure 7:
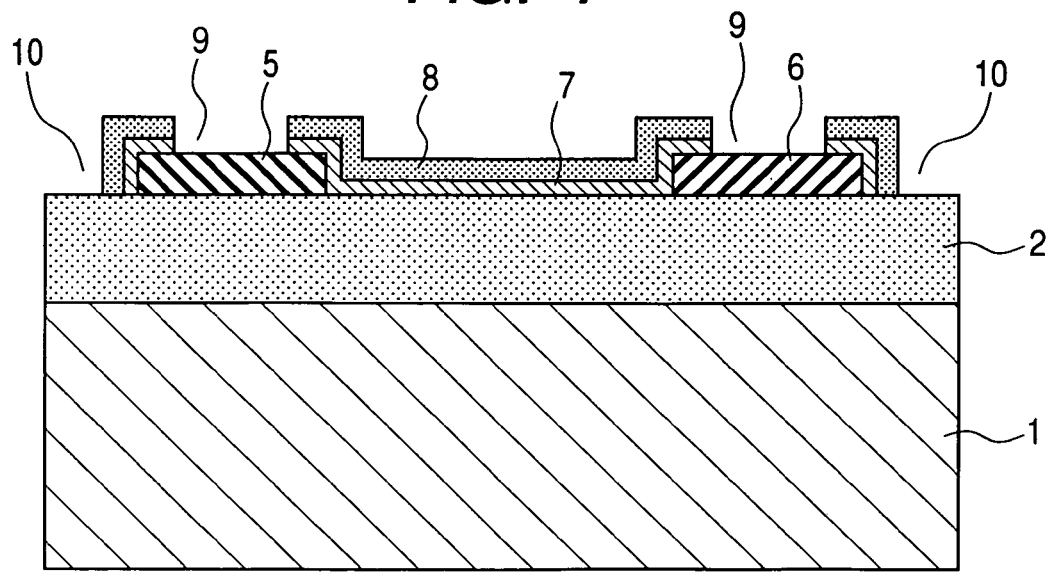
FIG. 7 is a cross-sectional drawing illustrating a manufacturing procedure of a silicon light-emitting diode in the first embodiment of the present invention.
Figure 8:
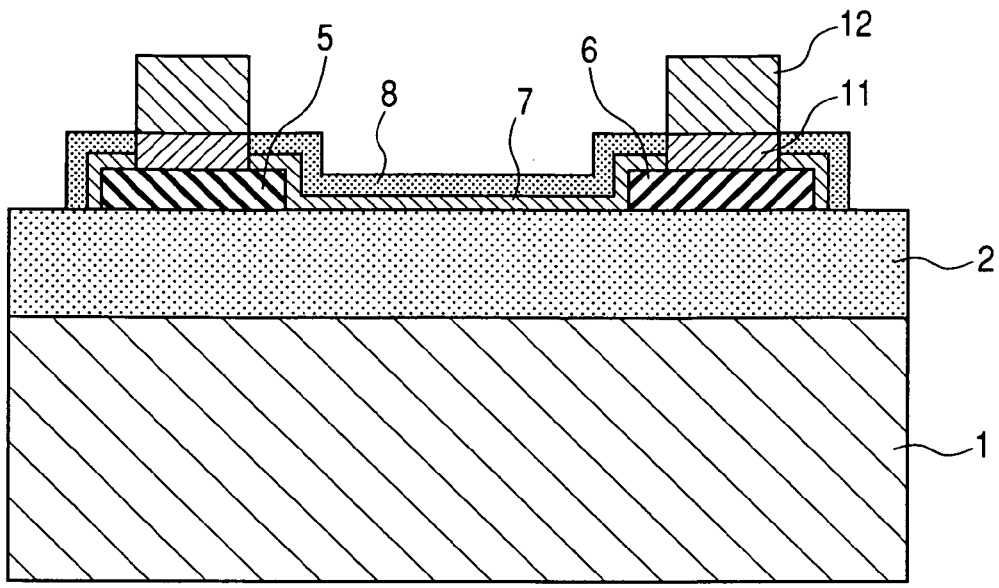
FIG. 8 is a cross-sectional drawing illustrating a manufacturing procedure of a silicon light-emitting diode in the first embodiment of the present invention.
Figure 9:
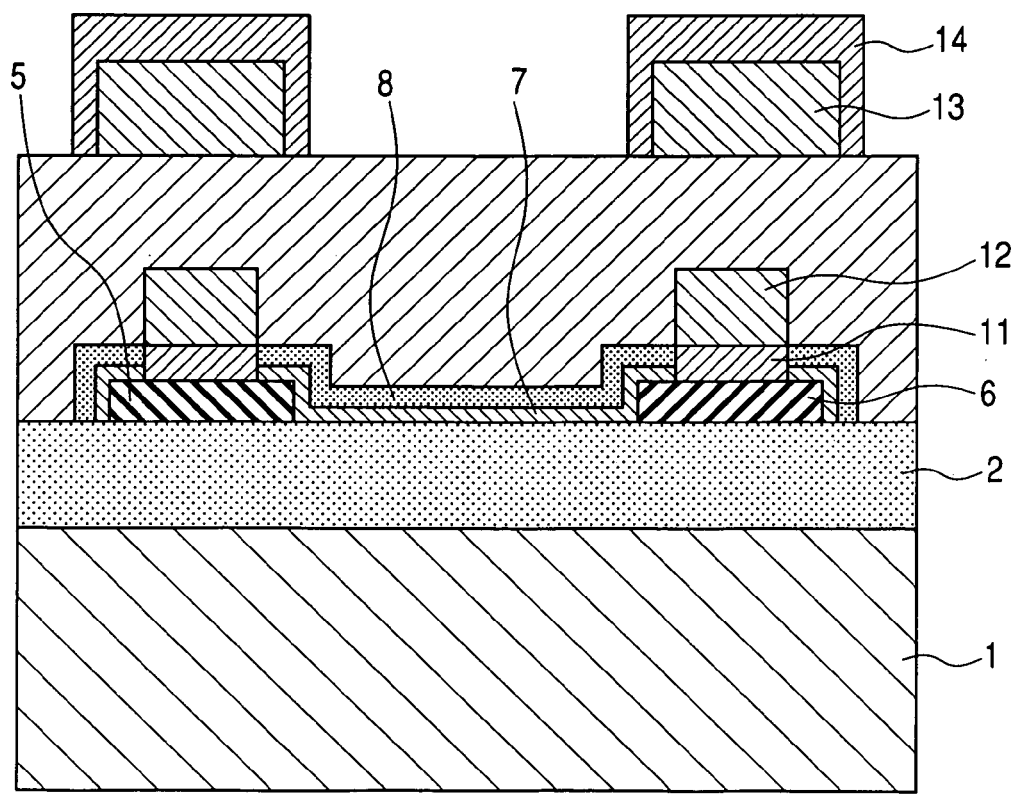
FIG. 9 is a finished cross-sectional drawing illustrating a silicon light-emitting diode in the first embodiment of the present invention.

Next, the opening hole 9 was made at a part of the electrode as shown in FIG. 7 by resist-patterning using a conventional photolithography technique and wet etching using HF. Here, extra ultrathin amorphous silicon was removed at the space between the pixels by using the aforementioned cleaning treatment and the ultrathin amorphous silicon removed part 10 was formed. Next, TiN and Al were deposited over the entire surface; the resist remained only over the desired region by resist-patterning using a photolithography technique; Al was wet etched by using a solution containing phosphoric acid, acetic acid, and nitric acid; and TiN was wet etched by using an etching solution containing ammonia and hydrogen peroxide solution. As a result, a TiN electrode 11 and an Al electrode 12 were patterned to make the state shown in FIG. 8. Then, the circuit shown in FIG. 1 was configured by depositing between the wiring layers and performing a desired wiring process and each wiring was connected to the driver circuit.

Next, an anti-reflection coating 13 was deposited over the entire surface to display a black color without reflecting light from the outside. The anti-reflection coating 13 includes a single or plural dielectrics and the film thickness is designed so as to make it easy to be transparent while not reflecting visible light from the outside. The light from the outside through the anti-reflection coating 13 is absorbed in the silicon substrate 1. Now, the selecting transistor and the driving transistor exist right below the SiLED and, when the light from the outside irradiates these transistors, photocurrent flows due to the light from the outside, so that it is not desirable. In such a case, it is preferable for the absorption of the light from the outside to arrange a polycrystalline silicon at the upper part of these transistors. On the other hand, emission from the SiLED can observed for each sub-pixel by previously forming a photodiode at a part below the pixel and the results can be fed back to the pixel control circuit, thereby it could be corrected to obtain a desired emission intensity even if the film thickness of the ultrathin amorphous silicon which will be a light emission layer varies locally on the atomic level. Moreover, the light from the outside was reflected by the metal at the upper part of the Al electrode 12 and the wiring, even if such an anti-reflection coating 13 was formed, so that a black display part 14 which became a black matrix was formed thereon. A stacking layer of chromium and chromium oxide and a resin can be used for a material of the black display part 14, and it could be easily processed by using conventional photolithography.

After that, a hydrogen annealing treatment was performed at 400° C. and defects formed during processing were treated by hydrogen termination, resulting in the display being completed. The prepared display could display full color and the brightness could be controlled in each pixel because of the self emission. Moreover, because a light emission switch was attached to each pixel, the power consumption was small. Moreover, since silicon with guaranteed reliability was used as a luminescent material, it was confirmed that a lifetime of more than 10 years was secured. Moreover, since emission can be switched with a speed of 1 μs or less and the response is remarkably high, it became clear that it is suitable for displaying video images as in sports. The silicon display disclosed in this embodiment can be manufactured by using a conventional silicon LSI process line and a TFT line for a liquid crystal without particularly additional investment. Therefore, with no investment in plant and equipment, a self emission silicon display can be manufactured in about ⅓ the number of steps of a conventional liquid crystal process.

Second Embodiment

In this embodiment, an embodiment is disclosed where a full color display is realized by combining a SiLED which emits white and a color filter.

Figure 12:
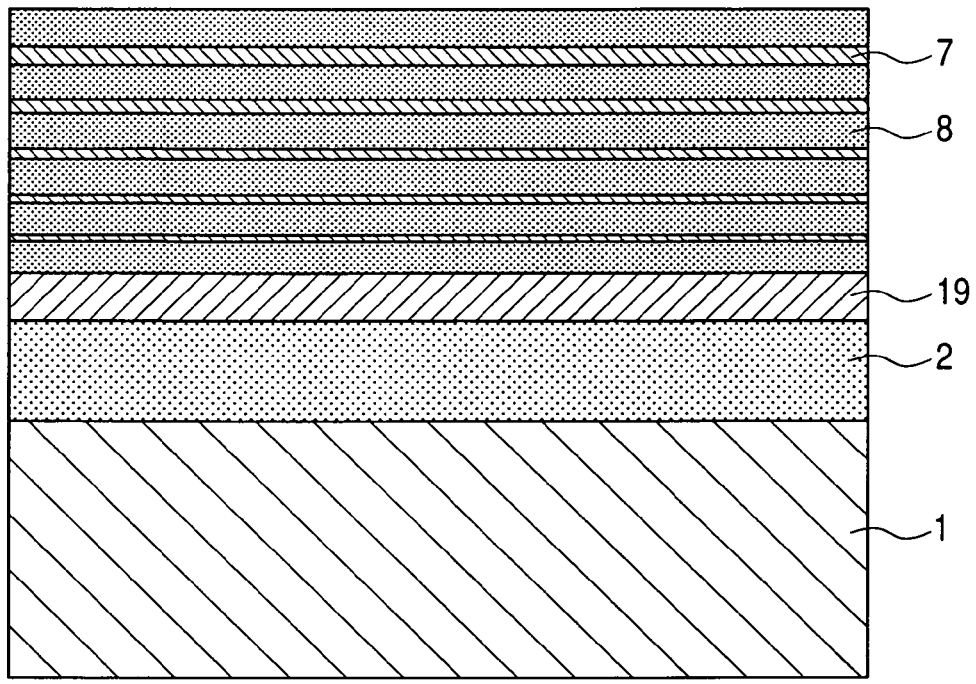
FIG. 12 is a cross-sectional drawing illustrating a manufacturing procedure of a silicon light-emitting diode in the second embodiment of the present invention.

As shown in FIG. 12, a silicon dioxide 2 and a silicon nitride 19 were deposited over the silicon substrate 1. A glass substrate may be used as the substrate instead of using the silicon substrate. The same as the first embodiment, a transistor for controlling the pixel and the driving driver circuit previously shown in the circuit diagram of FIG. 1 are integrated over the silicon substrate 1. The silicon dioxide 8 and the ultrathin film silicon 7 are continuously stacked alternately by using a CVD (Chemical Vapor Deposition) technique.

Herein, the silicon dioxide 8 was controlled to be a fixed thickness of 10 nm, and the film thickness of the ultrathin amorphous silicon 7 was controlled to be five different values: 0.5 nm, 1.0 nm, 1.5 nm, 2.0 nm, and 2.5 nm. Herein, one which mainly contributes to the visible light emission is the ultrathin amorphous silicon with a thickness of 1.0 nm, 1.5 nm, and 2.0 nm, for emitting blue, green, and red light, respectively. By inserting the ultrathin amorphous silicon with a film thicknesses of 0.5 nm and 2.5 nm, a robust design was applied to the variation of film thicknesses which may be caused in the process. By inserting the ultrathin amorphous silicon with film thicknesses of 0.5 nm and 2.5 nm, a robust design was applied to the variation of film thicknesses which may be caused in the process. When the film thickness deviates more than ±0.5 nm from the design, it was designed to obtain the light emissions of blue, green, and red which are assumed to be the target. As a result, the yield of the element could be successfully improved dramatically.

Moreover, there are many advantages to simultaneously using the ultrathin amorphous silicon having plural film thicknesses. For instance, the human eyes are more sensitive to the green color than the other colors. Concerning this matter, a more natural white color can be obtained by making the film thicknesses of the ultrathin amorphous silicon 7 five layers of, for instance, 1.0 nm, 1.0 nm, 1.5 nm, 2.0 nm, and 2.0 nm. Moreover, if we generally say the white color, people have preferences, so that various whites can be expressed by making the reds and blues strong according to their preference. The number of the stacking pairs where the ultrathin amorphous silicon and the silicon dioxide are alternately stacked is not limited to five layers, and it may possible if it is 10 layers and even 100 layers. Because the white color can be freely controlled, it becomes clear that the white SiLED of the present invention can be used for lighting. Moreover, not only white but also subtle pastel colors such as pink and orange can be expressed only by controlling the film thicknesses of the plural ultrathin amorphous silicon.

Figure 13:
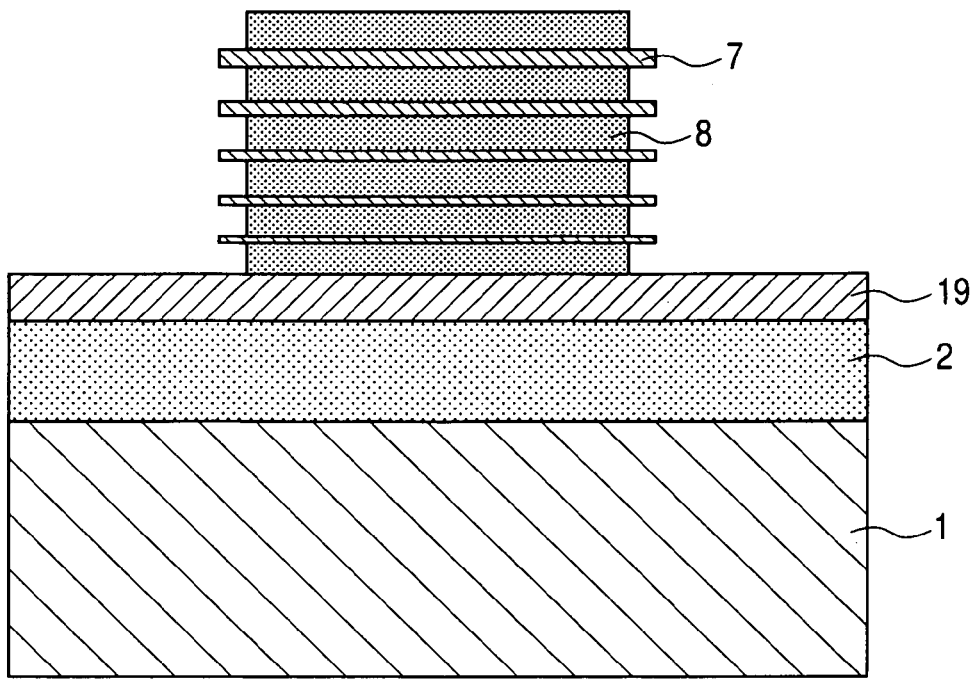
FIG. 13 is a cross-sectional drawing illustrating a manufacturing procedure of a silicon light-emitting diode in the second embodiment of the present invention.

Next, the silicon dioxide 8 and the ultrathin amorphous silicon 7 were processed by resist patterning using and dry-etching conventional photolithography, and the resist was removed by using a resist stripper and a cleaning process. In this dry-etching, the silicon nitride 19 was used for the stopper layer of the etching. Then, the sides of the silicon dioxide 8 were slightly drawn back by performing a cleaning treatment in a solution which contains hydrofluoric acid and processed to be the state shown in FIG. 13 where the sides of the ultrathin amorphous silicon 7 were exposed.

Figure 14:
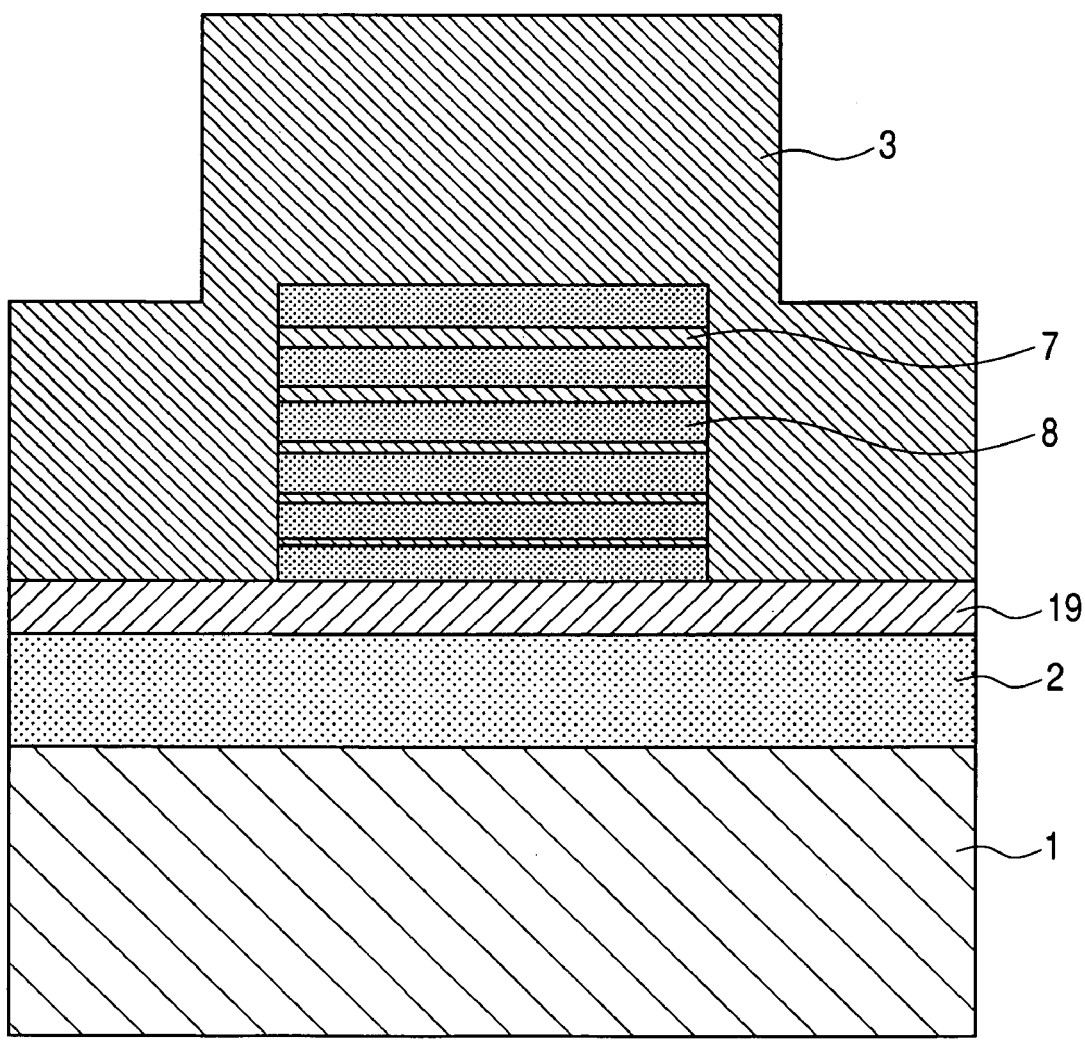
FIG. 14 is a cross-sectional drawing illustrating a manufacturing procedure of a silicon light-emitting diode in the second embodiment of the present invention.
Figure 15:
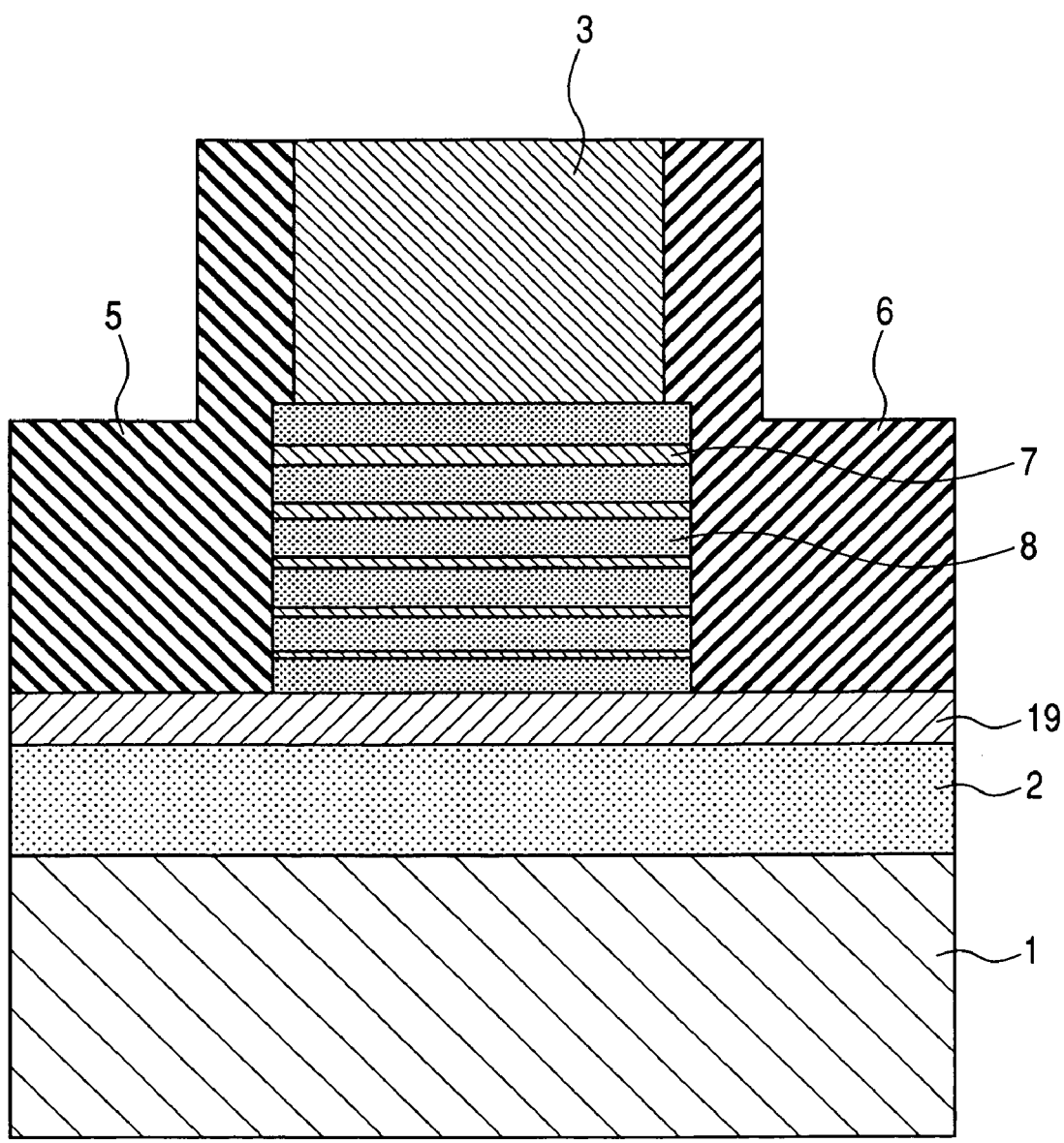
FIG. 15 is a cross-sectional drawing illustrating a manufacturing procedure of a silicon light-emitting diode in the second embodiment of the present invention.

Next, the state shown in FIG. 14 was made, in which the polycrystalline silicon 3 was deposited by using a CVD technique over the entire surface. Next, the silicon dioxide was deposited over the entire surface by using a CVD technique (not shown in the figure), resist patterning by using conventional photolithography and ion injection were performed, and the process for removing the resist were repeated. Then, the injected impurities were activated by annealing in nitrogen atmosphere and, by performing a cleaning treatment in a solution containing HF, the silicon dioxide was removed to make the state shown in FIG. 15 in which the p-type Si electrode 5 and then-type electrode 6 were formed.

Figure 16:
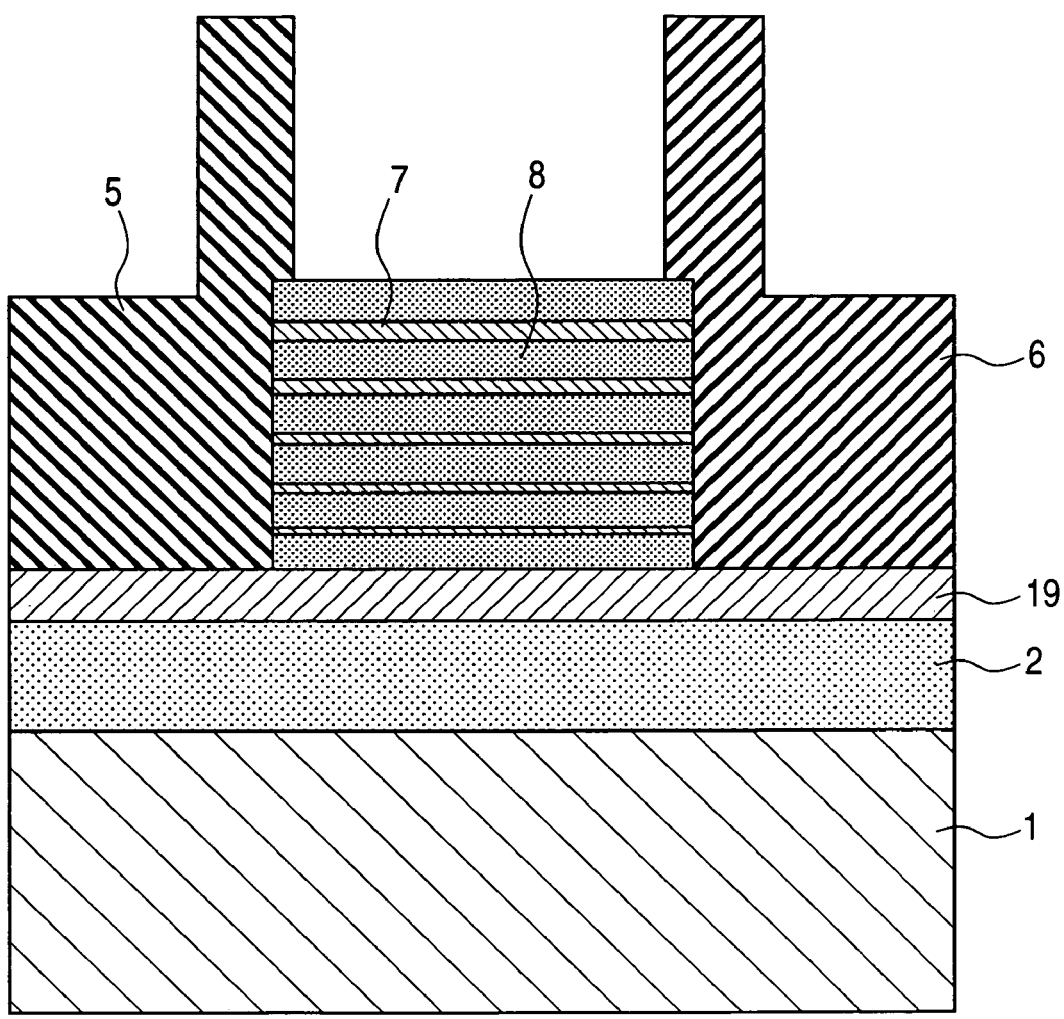
FIG. 16 is a finished cross-sectional drawing illustrating a silicon light-emitting diode in the second embodiment of the present invention.

Next, the polycrystalline silicon 3 was processed by resist patterning and dry-etching using conventional photolithography, and the state shown in FIG. 16 was made by removing the resist using a resist stripper and a cleaning process. In this dry etching, the silicon dioxide 8 of the uppermost part was used as an etching stopper.

Using the same manufacturing method as the first embodiment, a desired circuit was formed by a wiring process, such as deposition of the interlayer dielectric film, the opening hole, and processing TiN and Al; and the black display part to be the black matrix was manufactured by depositing the anti-reflection coating. After that, a hydrogen annealing treatment was performed at 400° C. and defects formed while processing were treated by hydrogen termination. According to a well-known manufacturing method, a color filter was arranged over the desired pixel, resulting in completing the display.

The manufactured display could display full-color. The display based on this embodiment includes the combination of a white SiLED and a color filter and a part of the light contained in the white color is removed by the filter. Therefore, the power consumption thereof was greater than the display disclosed in the first embodiment, in which red, green, and blue were emitted directly. However, the increase in the power consumption was about three times at the highest, and the power consumption of the SiLED was originally low, so that it was within the allowable level. The tolerance of a display based on this embodiment to variations in the film thickness in the atomic layer level was improved, resulting in the final yield of the display being improved.

Moreover, according to this embodiment, since a white LED with a low cost and large surface area was realized by using the silicon process, it became clear that it can also be applied to a back light of a liquid crystal display. In this case, the whole panel module can be made thinner and much lighter. The combination with conventional liquid crystal technology improves the correspondence to a wide screen such as a television. When the ultrathin silicon can be formed uniformly on a wide screen, it is needless to say that a self-emission display is superior from the viewpoint of the power consumption and the cost without taking the trouble to use a liquid crystal. Moreover, since a low cost white LED was achieved, it can be used for lighting. When it is applied to lighting, the anti-reflection coating and the black display part are not always necessary. Furthermore, when it is applied to lighting, in addition to the unnecessary displaying of black, a strong emission strength is preferable, so that it is preferable to let the light radiating to the lower side reflect to the upper side by arranging a metal such as Al toward the lower part of the white SiLED.

Third Embodiment

This embodiment discloses a display, where the emission efficiency is enhanced, and a manufacturing method thereof by making the silicon thin film containing nanocrystalline silicon and ultrathin amorphous silicon a light emission layer.

First, the state shown in FIG. 4 was made by using the same method as the first embodiment, in which a p-type Si electrode 5 and an n-type Si electrode 6 were processed.

Figure 17:
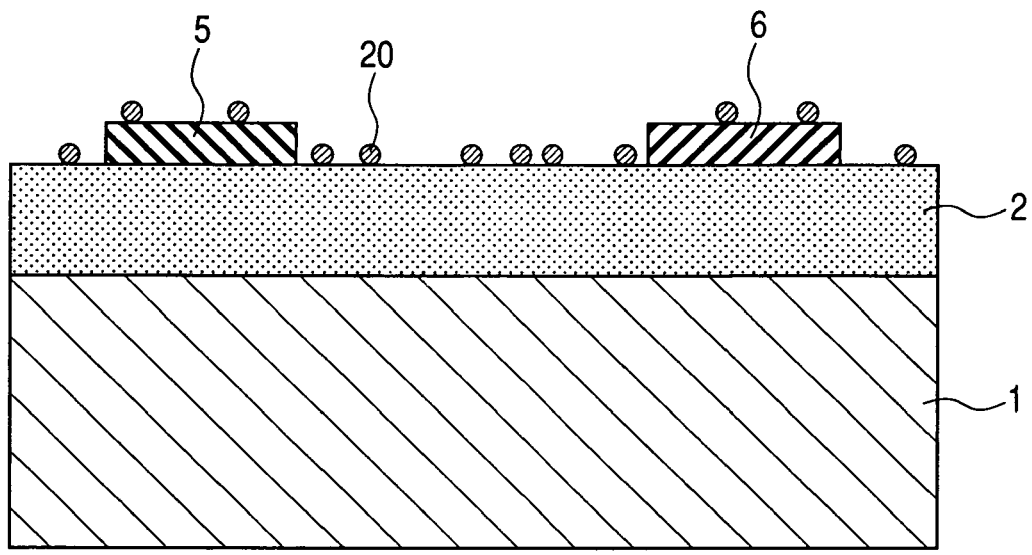
FIG. 17 is a cross-sectional drawing illustrating a manufacturing procedure of a silicon light-emitting diode in the third embodiment of the present invention.

Next, as shown in FIG. 17, nanocrystalline silicon 20 was deposited over the entire surface by using a CVD technique. The size of the nanocrystalline silicon 20 was 5 nm or less and the variation thereof was about several nanometers. The greater the density of nanocrystalline silicon the more desirable, but an appropriate density is desirable because nanocrystalline silicon becomes mutually connected when they grow too much. In this embodiment, nanocrystalline silicon was arranged to be $3 \times 10^{12}$ cm$^{-2}$. The size of the nanocrystalline silicon is desirably controlled according to the designed emission wavelength.

Figure 18:
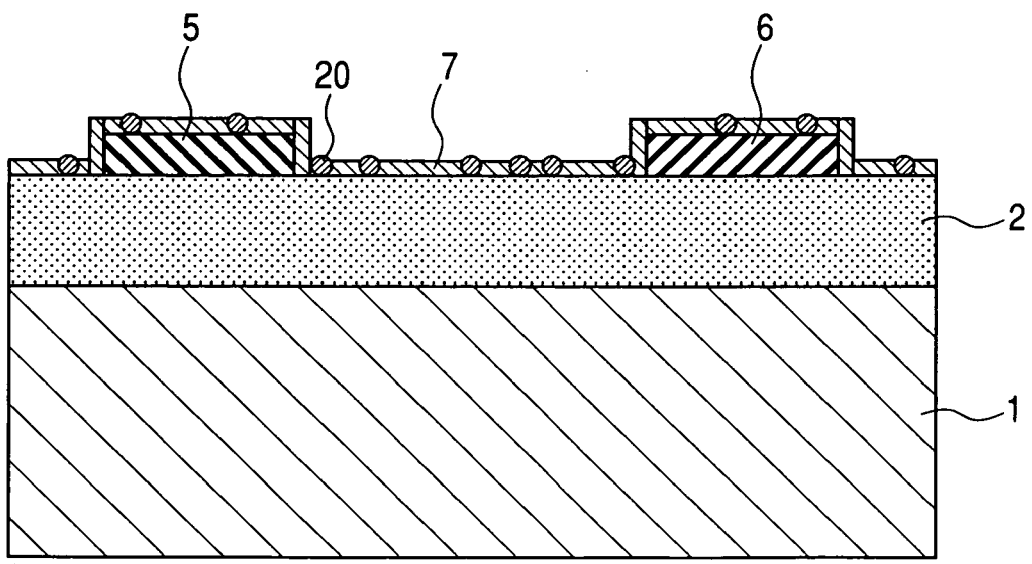
FIG. 18 is a finished cross-sectional drawing illustrating a silicon light-emitting diode in the third embodiment of the present invention.
Figure 19:
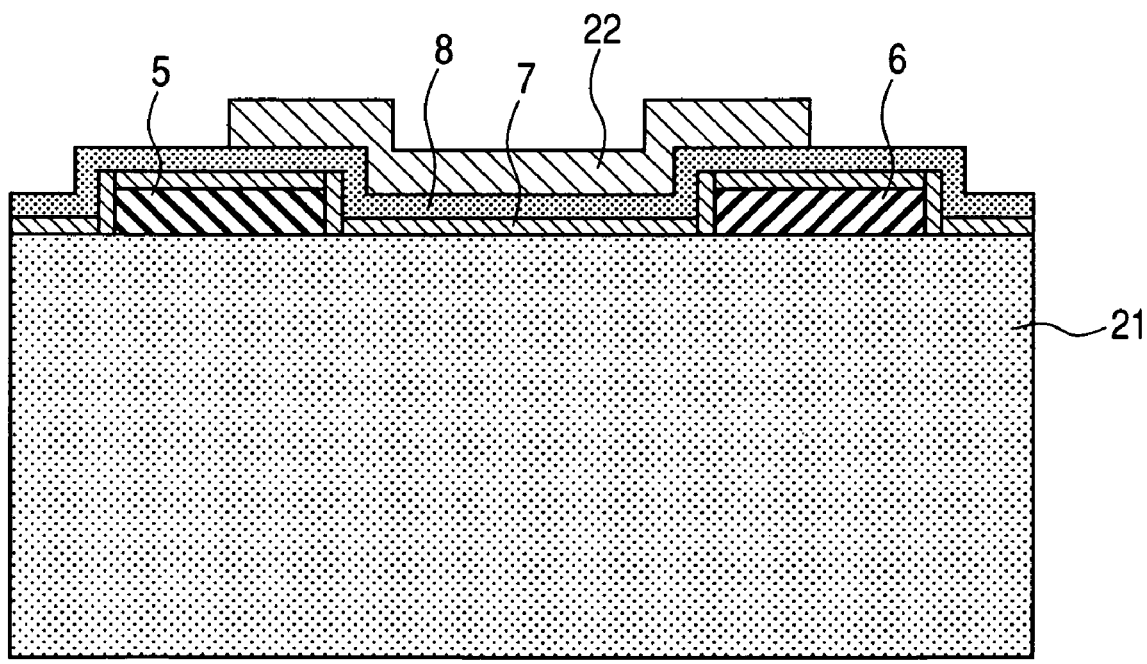
FIG. 19 is a finished cross-sectional drawing illustrating a silicon light-emitting diode in the fourth embodiment of the present invention.

Next, as shown in FIG. 17, the state shown in FIG. 18 was made in which the ultrathin amorphous silicon 7 was deposited over the entire surface by using a CVD technique. Herein, the film thickness of the ultrathin amorphous silicon 7 was controlled to be 0.7 nm. The role of the ultrathin amorphous silicon 7 is to supply carriers from the electrode to the nanocrystalline silicon. However, when the film thickness of the ultrathin amorphous silicon is large, carriers hardly migrate to the nanocrystalline silicon, so that a thinner film thickness of the ultrathin amorphous silicon is preferable. More concretely, the band gap value of the ultrathin amorphous silicon which is increased by a quantum confinement effect is preferably greater then the band gap value of the nanocrystalline silicon. It can be easily confirmed by checking the emission wavelength by photoluminescence. It is because the peak value of the emission wavelength of photoluminescence shows the band gap. Actually, the film thickness of the ultrathin amorphous silicon 7 was 0.7 nm and the peak emission wavelength was about 416 nm, and the peak wavelength of the nanocrystalline silicon was about 450 nm. As a result, smooth carrier migration from the ultrathin amorphous silicon to the nanocrystalline silicon was realized.

Afterwards, using silicon dioxide as a passivation interlayer film, the display was completed through a wiring process similar to the first embodiment and the second embodiment. Since the SiLED based on this embodiment emits only blue light, phosphors emitting the desired color were arranged to the red and green parts of the pixel, respectively, instead of using a color filter shown in the second embodiment. It is needless to say that the blue color part of the pixel does not need a color filter and a phosphor.

Since the full-color display of the present invention uses nanocrystalline silicon, the exchange efficiency from electricity to light was high and the power consumption was low. Moreover, since the number of steps of the process could be simplified, the manufacturing cost could be kept low.

Fourth Embodiment

In this embodiment, a display including a silicon emission transistor and a manufacturing method thereof are disclosed, in which a driving transistor was assumed to be unnecessary by forming the gate electrode onto SiLED.

In this embodiment, a top gate structure using a glass substrate was adopted as a substrate. That is, the gate electrode is formed at the upper part of the channel and emission is output to the substrate side. Although a silicon substrate may be used as the substrate, in this case, it is preferable to make it a bottom gate structure and take out the light at the upper part of the substrate.

First of all, a selecting transistor and a storage capacitor, etc. were formed with polycrystalline silicon by using the method similar to the first embodiment. Then, it was processed to be the state shown in FIG. 6, in which a SiLED displaying each sub-pixel with red, green, and blue color. It is not necessary to specially prepare a driving transistor because the function thereof is let the emission diode have it.

Next, the polycrystalline silicon doped with an impurity with high concentration was deposited over the entire surface by a CVD technique, and the polycrystalline silicon gate electrode 22 was patterned by using a well-known photolithography and a dry etching technique. An n-type and a p-type may be used for the impurity and it was made n-type by doping phosphorus in this embodiment. Thus, the function of the driving transistor was provided for the SiLED by forming the gate electrode over the SiLED. In other words, a silicon emission transistor where the emission strength can be controlled by the gate was prepared.

Afterwards, a display was completed through a wiring process similar to the first embodiment. Since the light is output to the side opposing the device formation face of the glass substrate in this embodiment, it is necessary to perform the antireflection treatment on the lower side of the glass substrate. Moreover, since the light being emitted to the upper side is also reflected to the lower side by the gate electrode, the ejection efficiency of the light can be improved, but it is necessary to contrive an antireflection treatment for the outside light from the lower side of the glass substrate. It can be dealt with by a well-known method. That is, a ¼ wave plate and a circular deflecting plate should be provided on the lower side of the glass substrate which becomes the side for taking out the light. As a result, the light from the outside is canceled almost perfectly. On the other hand, the emission from the silicon light-emitting transistor is reduced by half but the effect is compensated by the increase in the ejection efficiency of the light which is increased by the gate electrode.

As for the experimental results of the silicon display of this embodiment, the driving transistor could be deleted and the surface area of the light emission element in the pixel could be expanded.

What is claimed is:

1. A semiconductor device comprising:
   a silicon film formed over a substrate;
   a p-type silicon electrode and an n-type silicon electrode formed opposing each other over said substrate to sandwich said silicon film; and
   an electrode arranged over said silicon film through an insulator film,
   wherein said silicon film is an amorphous or polycrystalline silicon film with a film thickness of 5 nm or less.

2. The semiconductor device according to claim 1,
   wherein said p-type silicon electrode and said n-type silicon electrode are connected to a field-effect transistor.

* * * * *